United States Patent
Schofield et al.

(10) Patent No.: US 6,542,099 B1
(45) Date of Patent: Apr. 1, 2003

(54) DIGITAL TO ANALOG INTERFACE WITH EQUALIZED TOTAL SIGNAL DELAY AND METHOD OF MAKING IT

(75) Inventors: William G. J. Schofield, North Andover, MA (US); Douglas A. Mercer, Bradford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/990,985

(22) Filed: Nov. 21, 2001

(51) Int. Cl.$^7$ ............................................. H03M 1/66
(52) U.S. Cl. ........................ 341/144; 333/62; 327/395
(58) Field of Search ........................ 341/144; 333/62; 327/293, 395

(56) References Cited

U.S. PATENT DOCUMENTS

| | | | | |
|---|---|---|---|---|
| 5,086,271 A | * | 2/1992 | Haill et al. | 333/22 R |
| 5,661,427 A | * | 8/1997 | McBride et al. | 327/236 |
| 6,219,384 B1 | * | 4/2001 | Kliza et al. | 327/158 |
| 6,285,723 B1 | * | 9/2001 | Yamada et al. | 327/229 |

* cited by examiner

Primary Examiner—Howard L. Williams
(74) Attorney, Agent, or Firm—Iandiorio & Teska; R. Stephen Rosenholm; Kirk Teska

(57) ABSTRACT

A method of equalizing total signal delay across a digital to analog interface includes constructing a plurality of unit digital to analog converter cells each having a clock input and a data input and an analog output; constructing an analog output network for summing the analog outputs for delivery to a termination which in combination with the analog output network defines a first predetermined time delay between the unit cells; constructing a clock input distribution network for propagating a clock input to each of the unit cells tapped along the clock input distribution network; and connecting a second termination to the clock input distribution network for establishing the clock input distribution network as a transmission line and defining in combination with the clock input distribution network a second predetermined time interval delay between the clock input to the unit cells equal to the first predetermined in the interval delay for synchronizing the propagation of the clock inputs propagating along the clock input distribution network with the analog outputs propagating along the analog output network.

2 Claims, 7 Drawing Sheets

DIGITAL TO ANALOG INTERFACE WITH EQUALIZED TOTAL SIGNAL DELAY AND METHOD OF MAKING IT

FIELD OF THE INVENTION

This invention relates to a digital to analog interface with equalized total signal delay and a method of constructing it.

BACKGROUND OF THE INVENTION

Digital to analog converters (DAC's) have a plurality of unit cells for converting the digital input to an analog output in a timed operation directed by a clock input. Each cell typically has a data input circuit responsive to the clock input and digital data input and an analog output circuit responsive to the data input circuit to generate the analog output. There is a propagation delay as the analog output network sums the analog outputs of the analog output circuits tapped into it. These delays are generally uniform but they cause noise and distortion in the signal provided to the termination load. Additional noise and distortion occurs because of the delays from cell to cell, which are uniform, as the clock input propagates along the clock input distribution network. This latter error source at the clock input has been addressed by using a binary tree network input so that all clock inputs are delayed by the same amount to each cell. But this approach requires additional area and conductors on the chip which is not desirable. The former error source at the analog output has not been satisfactorily addressed. Simply adding a binary tree network here at the analog output mirroring the binary tree at the clock input is not acceptable because the area around the output is already dedicated to other necessary circuitry. Further, in some DAC's the current output is high and would require substantial size conductors to construct the binary tree.

BRIEF SUMMARY OF THE INVENTION

It is therefore an object of this invention to provide an improved digital to analog interface with equalized total signal delay and a method of constructing it.

It is a further object of this invention to provide such an improved digital to analog interface which eliminates the need for a binary tree at the clock input.

It is a further object of this invention to provide such an improved digital to analog interface which addresses the noise and distortion introduced at the analog output as well as the clock input.

It is a further object of this invention to provide such an improved digital to analog interface which is simple and requires very little additional area and not in the primary clock input area.

This invention results from the realization that a truly simpler and more effective digital to analog interface which addresses both clock input and analog output generated noise and distortion can be made by adding a termination on the clock input distribution network which turns it into a transmission line and enables the propagation delays of the clock input distribution network to be matched to that of the analog output network and its termination load so that the clock input and analog output delays are synchronized resulting in an equalized total signal delay across all of the unit cells of the interface.

This invention features a digital to analog interface with equalized total signal delay including a plurality of unit digital to analog converter cells each having a clock input and an analog output. A clock input distribution network propagates a clock input through the unit cells tapped along the distribution network. An analog output network sums the analog outputs from each unit cell and propagates the sum signal along the network to a first termination. The analog outputs being delayed from cell to cell by a first predetermined interval defined by the combination of the analog output network and the first termination. There is a second termination connected to the clock input distribution network for establishing the clock input distribution network as a transmission line and defining in combination with the clock input distribution network a second predetermined time interval delay between the clock inputs to the unit cells equal to the first predetermined time interval delay for synchronizing the propagation of the clock inputs propagating along the clock input distribution network with the analog outputs propagating along the analog output network.

The invention also features a method of equalizing total signal delay across a digital to analog interface including constructing a plurality of unit digital to analog converter cells each having a clock input and a data input and an analog output. An analog output network is constructed for summing the analog outputs for delivery to a first termination which in combination with the analog output network defines a first predetermined time delay between the unit cells. A clock input distribution network is constructed for propagating a clock input to each of the unit cells tapped along the clock input distribution network. A second termination is connected to the clock input distribution network for establishing the clock input distribution network as a transmission line and defining in combination with the clock input distribution network a second predetermined time interval delay between the clock inputs to the unit cells equal to the first predetermined interval delay for synchronizing the propagation of the clock inputs propagating along the clock input distribution network with the analog outputs propagating along the analog output network.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
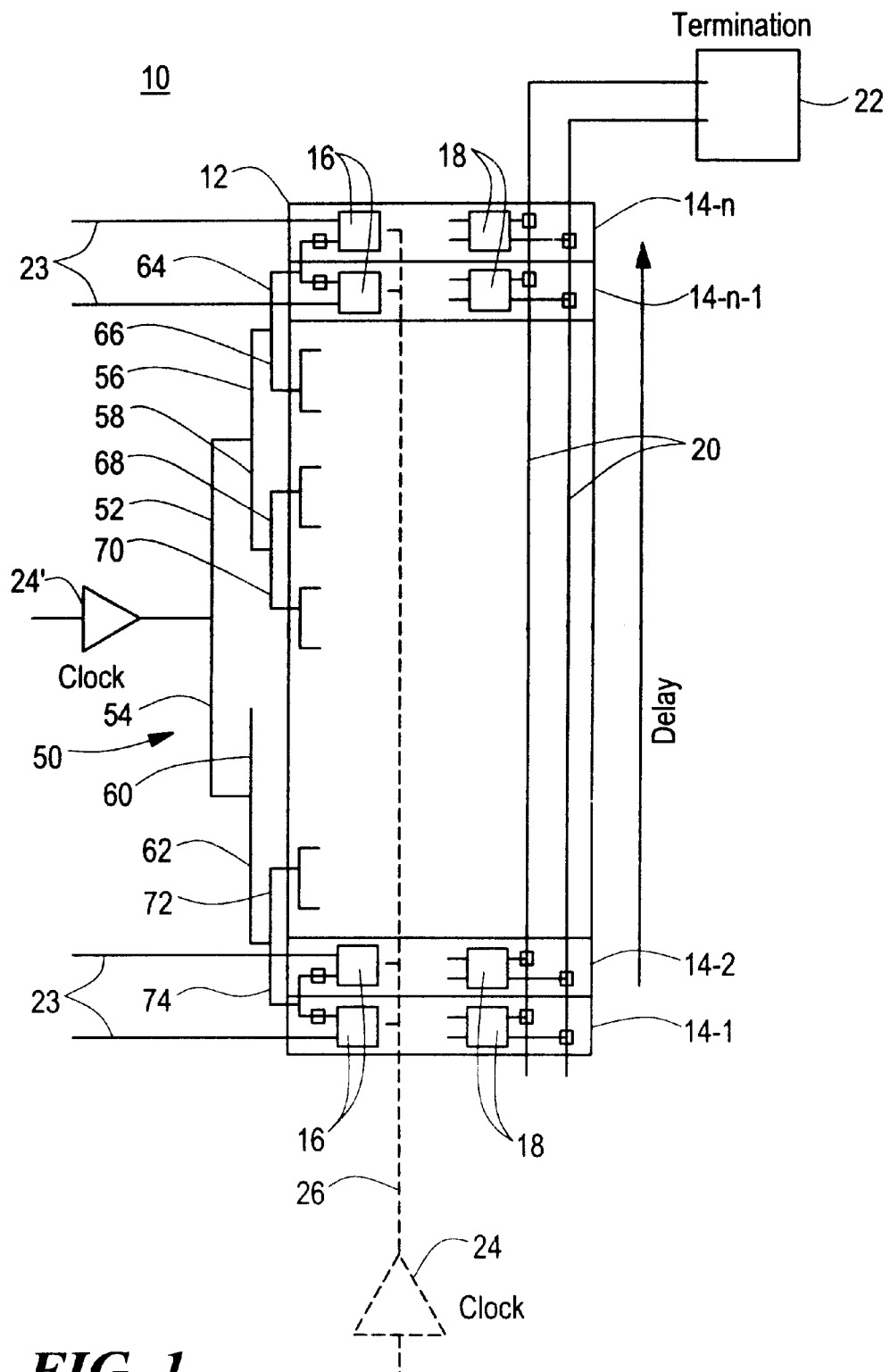
FIG. 1 is a schematic block diagram of a prior art digital to analog interface of a DAC using a binary tree clock input.

There is shown in FIG. 1 a digital to analog converter (DAC) 10 including a digital to analog interface 12 consisting of a plurality of unit cells 14-1, 14-2 . . . 14-n-1, 14-n, each of which as illustrated with respect to unit cell 14-1 includes a data input circuit 16 with data inputs on line 23 and an analog output circuit 18. The analog output from each of the analog output circuits 18 in each of cells 14-1 through 14-n is delivered to analog output network 20 for ultimate submission to the termination or load 22. As the analog outputs from each cell 14-1 through 14-n are summed on analog output network 20, there is a propagation delay introduced which causes an error in the output. The delays are equal since each of the cells 14-1 through 14-n are identical and made on the same chip. Historically a clock circuit 24 provided over clock distribution network 26 a clock signal to each of the data input circuits 16 in each of the cells 14-1 through 14-n; that propagation delay too, again being equal from cell to cell, caused an error in the output.

Figure 2:
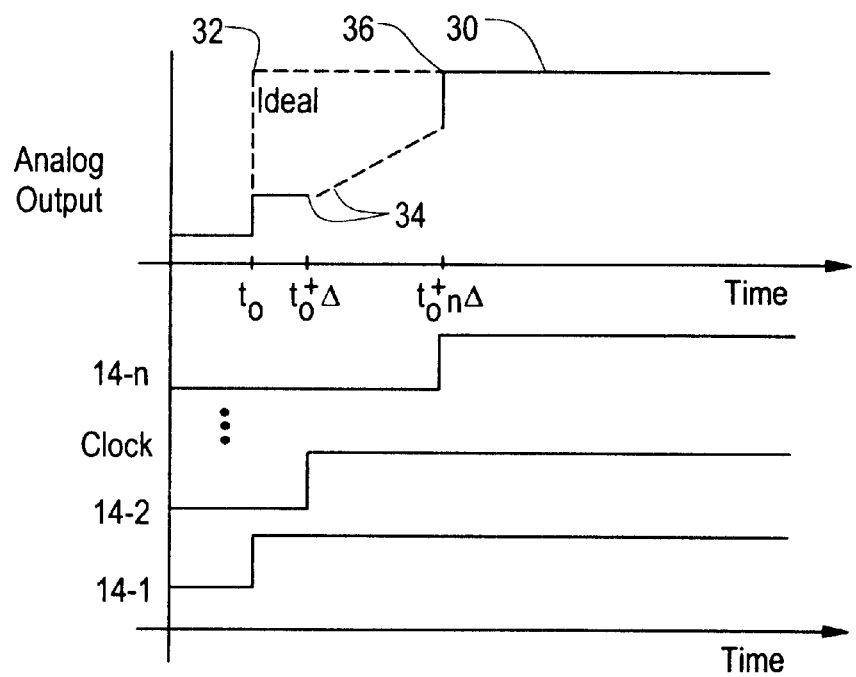
FIG. 2 illustrates the error in the analog output introduced by the misalignment of the clock signals from cell to cell in FIG. 1.

The error due to the propagation delays from cell to cell at the clock input are illustrated in FIG. 2. There it can be seen that the clock signals arriving at 14-1, 14-2, and 14-n rather than occurring simultaneously, occur at three different times, $t_0$, $t_{0+\Delta}$, $t_{0+n\Delta}$. As a result of this propagation delay in the clock input the analog output 30 instead of stepping directly up at point 32 in one large step, steps across in a number of small intermediate steps as shown at 34 until it finally arrives at level 36. The area between the boundaries defined by point 32 and steps 34 causes the errors.

Figure 3:
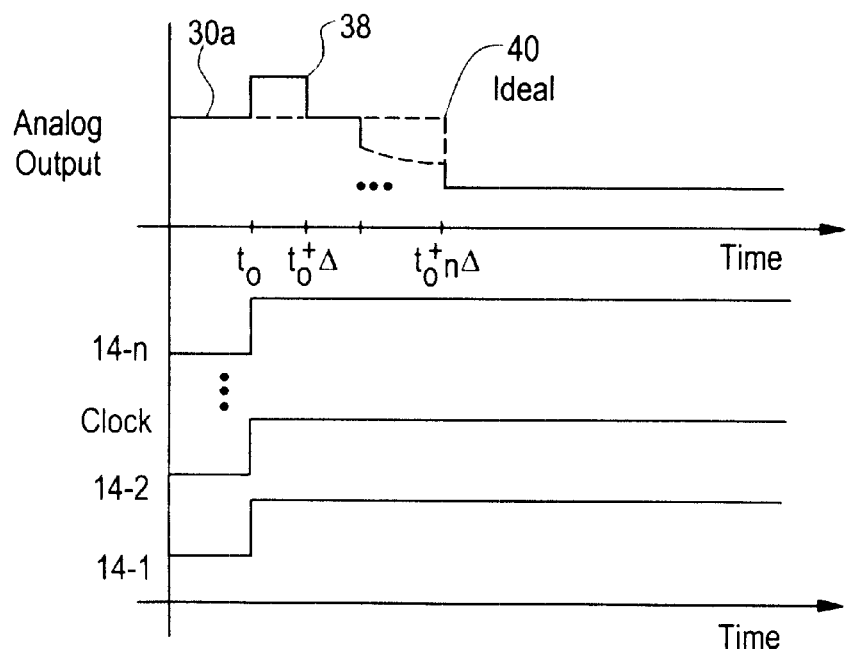
FIG. 3 illustrates the error in the analog output introduced by the misalignment of the summing of the individual cell analog outputs in FIG. 1.

The errors and distortion resulting from the propagation delay in the summing of the analog output signals on analog output network 20 is illustrated in FIG. 3 where it can be seen that even though all of the clock signals 14-1, 14-2, and 14-n are aligned and occurring at $t_0$, the analog output signal 30a has a step configuration 38 rather than a straight single break 40 because of the delay in the summing of the analog outputs at each subsequent cell at the times $t_0$, $t_{0+\Delta}$, and $t_{0+2\Delta}$, $t_{0+3\Delta}$... This data error source illustrated in FIG. 3 was addressed in the prior art by a binary tree 50, FIG. 1 in which the clock 24' drives a binary tree network of conductors so that no matter what path the clock signal travels it will travel the same distance to reach any of the cells 14-1 through 14-n. For example, whether the clock pulse travels on branch 52 or 54 and subsequently 56 or 58, 60 or 62, or in the final leg 64 or 66, 68 or 70, 72 or 74, the distance will be the same. In this way the time delay discussed in FIG. 2 with respect to the clock input distribution network is overcome but at the cost of adding a complex and space consuming tree of conductors.

Figure 4:
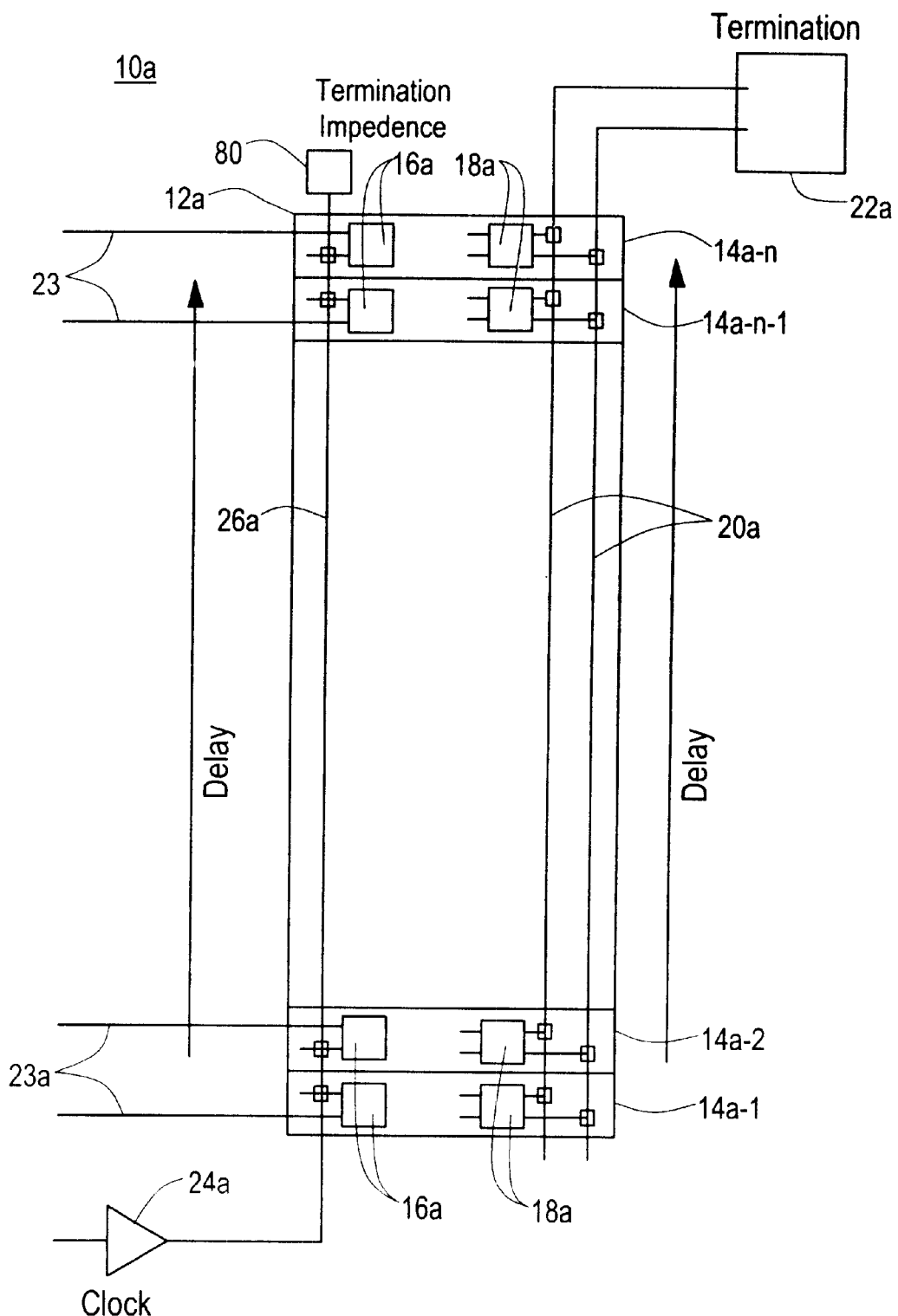
FIG. 4 is a schematic block diagram of a digital to analog interface with equalized total signal delay according to this invention.

In accordance with this invention, the DAC interface 12a, FIG. 4, includes clock input distribution network 26a which has, connected to its end, termination 80 which essentially makes network 26a a transmission line. The errors in distortion introduced in the analog output which come from the summing of the analog output are due to the resistances of the network 20a from cell to cell and the parasitic capacitance associated with the circuits in each cell, as well as the value of the termination or load associated with the analog output network 20a as depicted in FIG. 4. Similarly, the errors and distortion associated with the delays in the clock input signal are due to the resistance from cell to cell along network 26a and the parasitic capacitances associated with each of the cells. This invention results from the realization that by applying a termination to network 26a and making it effectively a transmission line, the termination 80 can be chosen in conjunction with a choice of the resistance along network 26a so that when combined with the parasitic capacitances associated with the cells, the propagation delays along network 26a can be made equal to those along the analog output network 20a so that the timing of the clock inputs and the summed analog outputs move synchronously in lock-step avoiding the error and the distortion associated with both of the delays. This is illustrated somewhat graphically in FIG. 5 where clock driver 24b drives clock input distribution network 26b whose resistance is represented as discreet values $r_1$, 100 associated with each cell; also present is the distributed capacitance 102 associated with the wiring and the capacitances 104 associated with each of the data input circuits 16b. The termination or load 22b on the analog output is a given or fixed value as is the distributed resistance 110 and capacitance 112 of the analog output network 20b which must carry the current to termination or load 22b. Also fixed is the parasitic capacitance 114 associated with each analog output circuit 18b of each cell. The parasitic capacitances 114 should be nearly equal since all of the unit cells are made in the same process on the same chip. Similarly the parasitic capacitances 104 associated with the data input circuits 16b are generally equal. Also the physical spacing from cell to cell $d_1$ at the data input circuits is the same as the spacing $d_2$ at the analog output circuits 18b. Thus with the time delay determined by the fixed parameters of the termination load 22b, the distributed resistances 110 and capacitances 112 of network 20b and the parasitic capacitances 114, the synchronization or matching of the propagation time of the clock input on network 26b to the analog outputs on network 20b can be accomplished by varying the termination 80b connected to clock input distribution network 26b and/or the distributed resistance 100 associated with network 26b. The predetermined time interval delay from cell to cell encountered by the propagating summed analog output signal on network 20b can be synchronized with the propagation of the clock input along network 26b so that the digital to analog interface has an equalized total signal delay and the errors and distortions illustrated in FIGS. 2 and 3 which occurred with the prior art devices, FIG. 1 can be eliminated.

Figure 6:
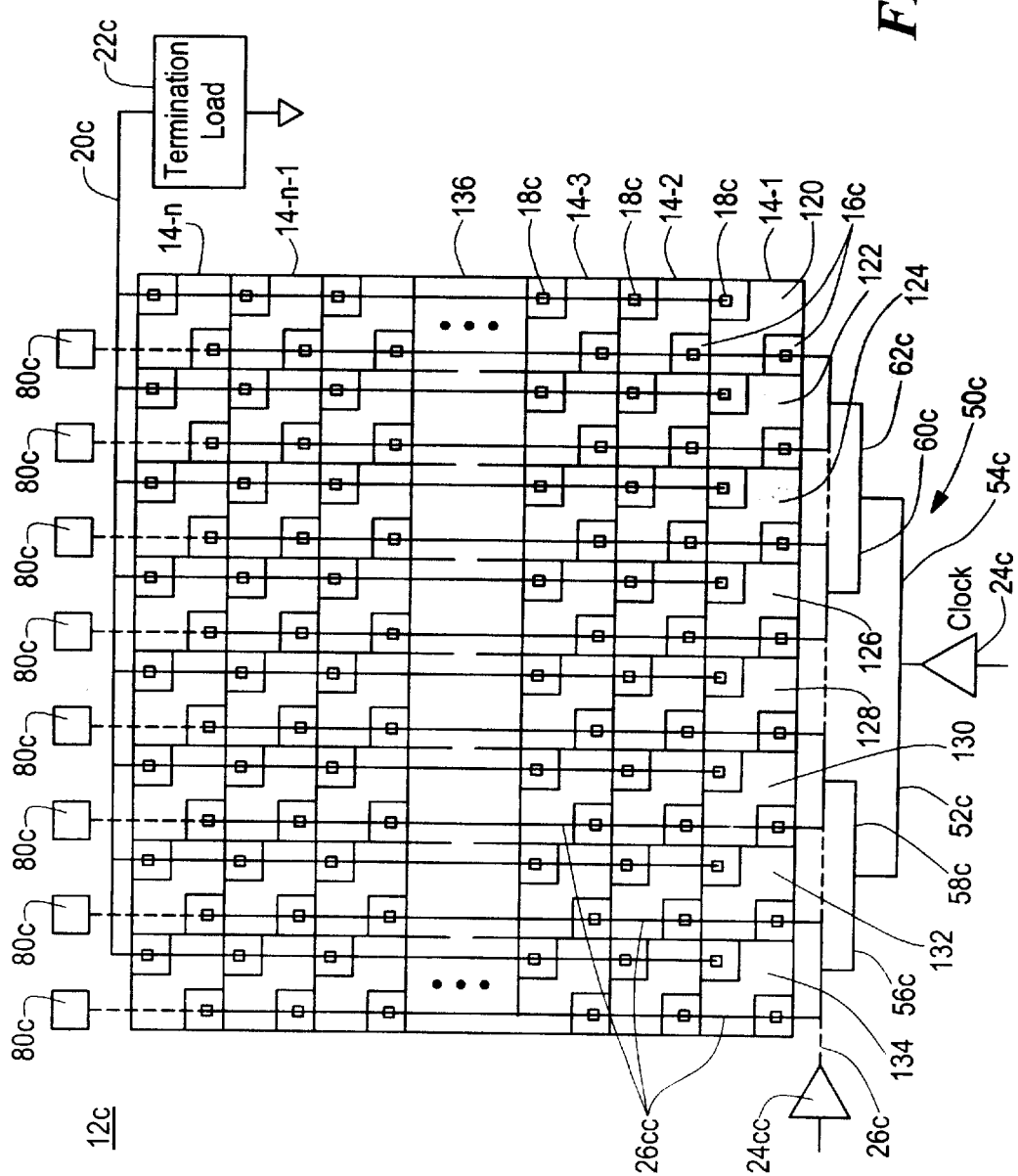
FIG. 6 is a schematic diagram of a prior art matrix digital to analog interface modified in accordance with this invention.

While thus far the illustrations in FIGS. 1 and 4 show a so-called one-dimensional array of unit cells making up the digital to analog interface, this is not a necessary limitation of the invention. For example, in FIG. 6 a two dimensional, or matrix, prior art digital to analog interface 12c is shown. Actually FIG. 6 can be envisioned as a repeating pattern of the one-dimensional array shown in FIGS. 1 and 4: that is, the entirety of the cell structure of the interface 12 in FIG. 1 or the interface 12a in FIG. 4 constitutes but a single column 120, 122, 124, 126, 128, 130, 132, and 134 of the matrix 136. For example, column 120 includes cell 14-1, 14-2, through 14-n, and each cell in each column includes a data input circuit 16c and analog output circuit 18c. A binary tree 50c driven by clock 24c operates each of the data input circuits 16c in each of the columns 120–134 with the clock input delays eliminated only by means of the complex and area consuming binary tree 50c. The analog outputs are summed from all of the analog outputs circuits 18c in each of the columns 120–134 on analog output network 20c from which they are delivered to termination 22c. In this prior art construction then the errors and distortion resulting from the problems indicated in FIG. 3 still occurs. In order to eliminate that source of error and to eliminate the source of error associated with the clock input propagation delays as well as eliminating the need for the binary tree 50c, the prior art device of FIG. 6 can be modified in accordance with this invention to provide, at the end of each leg 26cc of clock input distribution network 26c in each of the columns 120–134, a termination 80c and configuring the clock input distribution network 26c straight through as indicated by the dashed lines connecting the existing lines and eliminating clock 24c and lines 52c through 62c.

Figure 5:
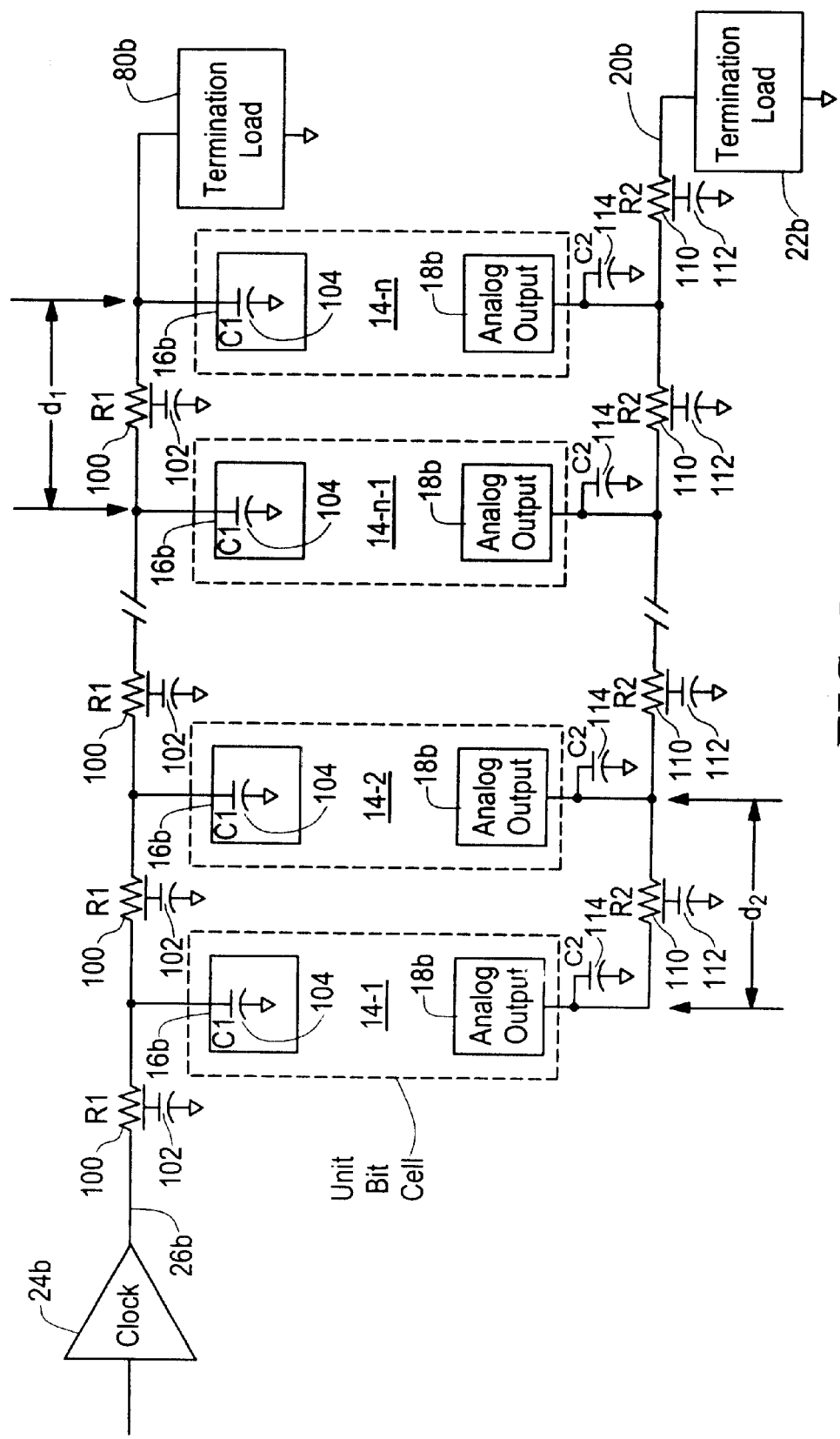
FIG. 5 is a schematic diagram illustrating the method of determining the termination to be connected to the clock input distribution network according to this invention.

An example illustrating a simple calculation to determine the discreet resistance 100 and termination 80b, FIG. 5 required to match the propagation delays of clock input distribution network 26b with those of analog output network 20b follows where:

$t_u$=unit time delay, that is the delay per cell along the analog output network 20b.

$R_1$=the resistance of the each of the unit resistors 100 along the clock input distribution network (100).

$C_u$=the capacitance of the unit capacitance of 104 of each cell+total input capacitance 102 associated with each cell.

$C_{termination}$=the capacitance of the termination 80b.

N=the number of unit cells.

Thus, applying the equation:

$$t_u = R_1 \times ((N \times C_u) + C_{termination}) \tag{1}$$

where $t_u$ is a given of 350 fsec $C_u$=13 fF,

N=64 and $R_1$=160 mOhms, and rearranging to solve for $C_{termination}$: one obtains the equation $$C_{termination} = t_u/R_1 - NC_u \tag{2}$$

then $C_{termination}$=350 fsec/160 mOhms−64*13 fF (3)

$C_{termination}$=1.35 pF (4).

Figure 7:
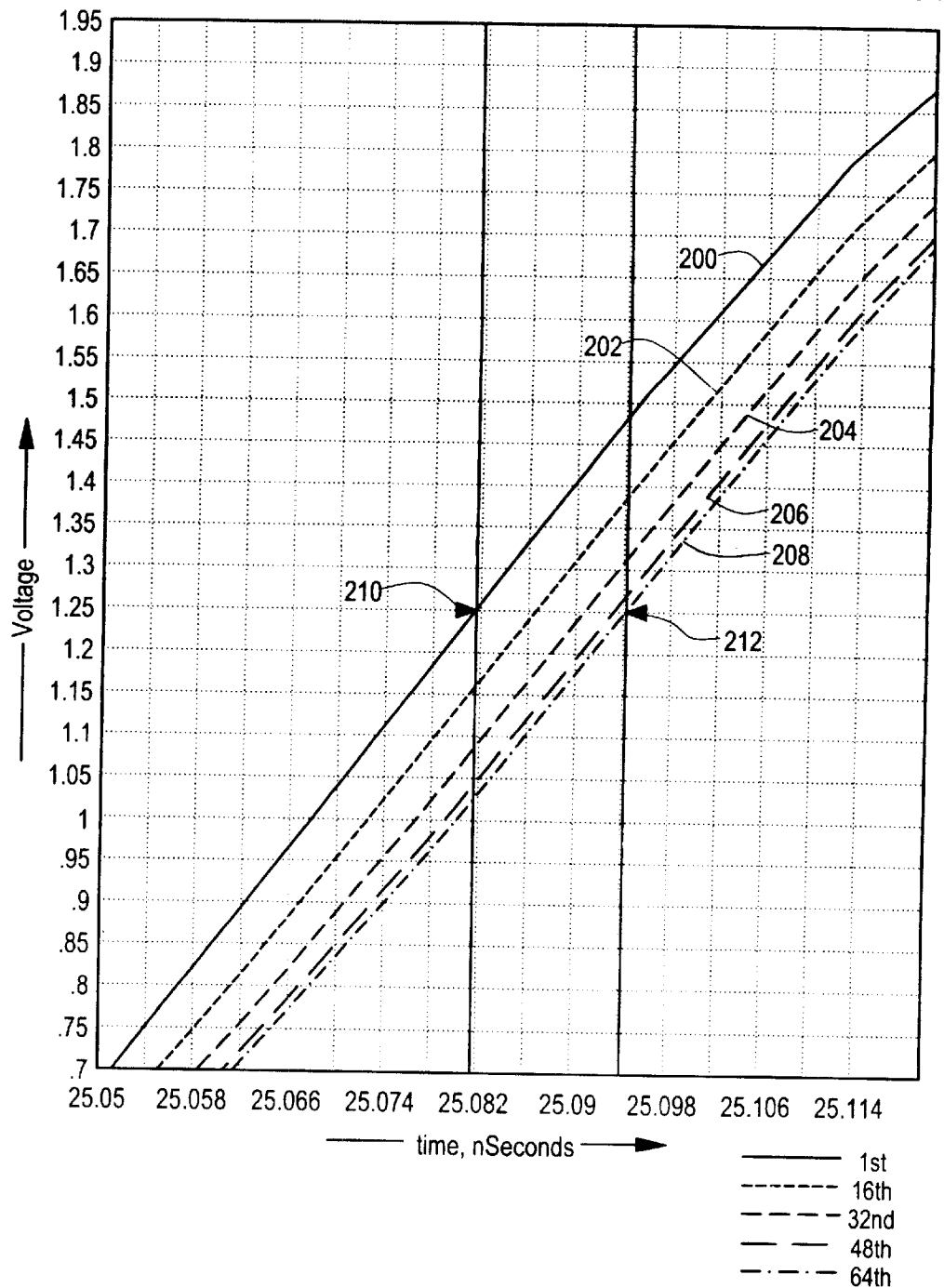
FIG. 7 illustrates the non uniform timing from cell to cell occurring in prior art devices without a termination on the clock input distribution network.
Figure 8:
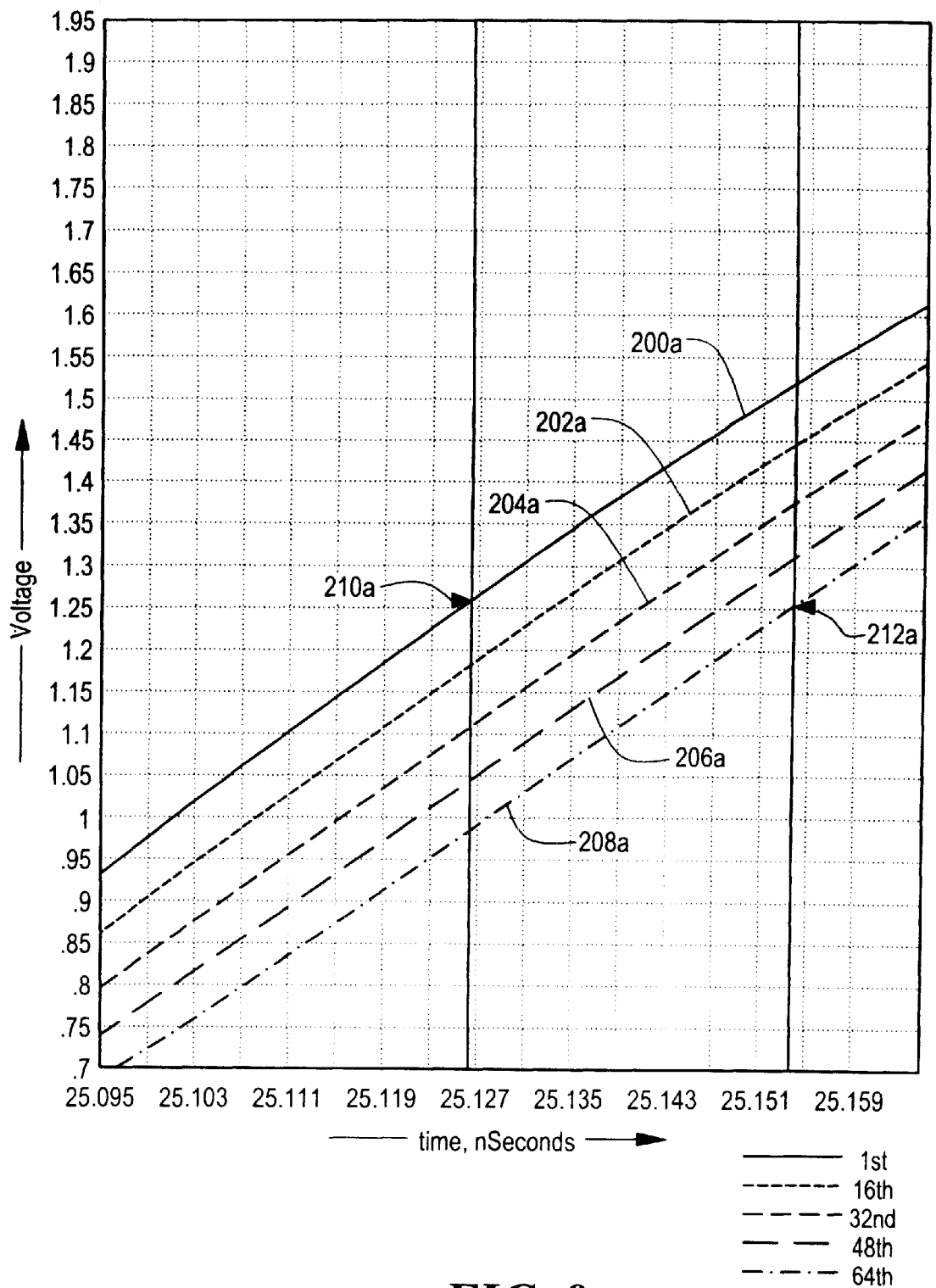
FIG. 8 is an illustration similar to FIG. 7 showing the more uniform time delays between the cells occurring when a termination is used according to this invention.

The non-uniform nature of the unit timing in prior art devices along the clock input distribution network without a termination is illustrated in FIG. 7 where the voltage is plotted against the time in nanoseconds for the first, sixteenth, thirty-second, forty-eighth, and sixty-fourth cells 200, 202, 204, 206, and 208. Viewing the time delays at arrowheads 210 and 212, it can be readily seen that the time intervals between those cells is non uniform. With termination according to this invention as shown in FIG. 8, with the delay once again viewed at arrows 210a and 212a appears to be much more uniform.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A digital to analog interface with equalized total signal delay comprising:

a plurality of unit digital to analog converter cells, each having a clock input and an analog output;

a clock input distribution network for propagating a clock input to said unit cells tapped along said distribution network;

an analog output network for summing the analog outputs from each unit cell and propagating the sum signal along the network to a first termination; said analog outputs being delayed from cell to cell by a first predetermined time interval defined by the combination of said analog output network and said first termination; and a second termination connected to said clock input distribution network for establishing said clock input distribution network as a transmission line and defining in combination with said clock input distribution network a second predetermined time interval delay between the clock inputs to said unit cells equal to said first predetermined time interval delay for synchronizing the propagation of the clock inputs propagating along the clock input distribution network with the analog outputs propagating along the analog output network.

2. A method of equalizing total signal delay across a digital to analog interface comprising:

constructing a plurality of unit digital to analog converter cells each having a clock input and a data input and an analog output;

constructing an analog output network for summing the analog outputs for delivery to a first termination which in combination with the analog output network defines a first predetermined time delay between said unit cells;

constructing a clock input distribution network for propagating a clock input to each of said unit cells tapped along the clock input distribution network; and connecting a second termination to said clock input distribution network for establishing said clock input distribution network as a transmission line and defining in combination with said clock input distribution network a second predetermined interval delay between the clock inputs to said unit cells equal to said first predetermined time interval delay for synchronizing the propagation of the clock inputs propagating along the clock input distribution network with the analog outputs propagating along the analog output network.

* * * * *